US009490360B2

(12) United States Patent
Chen et al.

(10) Patent No.: US 9,490,360 B2
(45) Date of Patent: Nov. 8, 2016

(54) SEMICONDUCTOR DEVICE AND OPERATING METHOD THEREOF

(71) Applicant: United Microelectronics Corp., Hsinchu (TW)

(72) Inventors: Ming-Shing Chen, Tainan (TW); Ming-Hui Chang, Tainan (TW); Wei-Ting Wu, Tainan (TW); Ying-Chou Lai, Nantou County (TW); Horng-Nan Chern, Tainan Hsien (TW); Chorng-Lih Young, Taoyuan County (TW); Chin-Sheng Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 17 days.

(21) Appl. No.: 14/183,541

(22) Filed: Feb. 19, 2014

(65) Prior Publication Data
US 2015/0236150 A1    Aug. 20, 2015

(51) Int. Cl.
*H01L 21/761*   (2006.01)
*H01L 29/78*    (2006.01)
*H01L 29/06*    (2006.01)
*H01L 29/40*    (2006.01)
*H01L 29/49*    (2006.01)
*H01L 29/66*    (2006.01)

(52) U.S. Cl.
CPC ......... *H01L 29/7816* (2013.01); *H01L 21/761* (2013.01); *H01L 29/0649* (2013.01); *H01L 29/402* (2013.01); *H01L 29/7835* (2013.01); *H01L 29/4933* (2013.01); *H01L 29/665* (2013.01)

(58) Field of Classification Search
CPC ............. H01L 29/404; H01L 29/0634; H01L 29/0646; H01L 29/7835; H01L 29/66659; H01L 21/761; H01L 29/402; H01L 29/0649; H01L 29/7816
See application file for complete search history.

(56) References Cited

U.S. PATENT DOCUMENTS

| | | | |
|---|---|---|---|
| 4,344,081 A | 8/1982 | Pao et al. | |
| 4,396,999 A | 8/1983 | Malaviya | |
| 4,893,160 A | 1/1990 | Blanchard | |
| 4,918,333 A | 4/1990 | Anderson et al. | |
| 4,958,089 A | 9/1990 | Fitzpatrick et al. | |
| 5,040,045 A | 8/1991 | McArthur et al. | |
| 5,268,589 A | 12/1993 | Dathe | |
| 5,296,393 A | 3/1994 | Smayling et al. | |

(Continued)

OTHER PUBLICATIONS

Khemka et al., "Novel FRESURF LDMOSFET Devices with Improved BVdss-Rdson," IEEE Electron Device Letters, Dec. 2004, pp. 804-806, vol. 25, No. 12.

*Primary Examiner* — Fazli Erdem
(74) *Attorney, Agent, or Firm* — J. C. Patents

(57) ABSTRACT

Provided is a semiconductor device including a P-type substrate, a P-type first well region, an N-type second well region, a gate, N-type source and drain regions, a dummy gate and an N-type deep well region. The first well region is in the substrate. The second well region is in the substrate proximate to the first well region. The gate is on the substrate and covers a portion of the first well region and a portion of the second well region. The source region is in the first well region at one side of the gate. The drain region is in the second well region at another side of the gate. The dummy gate is on the substrate between the gate and the drain region. The deep well region is in the substrate and surrounds the first and second well regions. An operation method of the semiconductor device is further provided.

19 Claims, 5 Drawing Sheets

(56) References Cited

U.S. PATENT DOCUMENTS

| | | |
|---|---|---|
| 5,326,711 A | 7/1994 | Malhi |
| 5,346,835 A | 9/1994 | Malhi et al. |
| 5,430,316 A | 7/1995 | Contiero et al. |
| 5,436,486 A | 7/1995 | Fujishima et al. |
| 5,534,721 A | 7/1996 | Shibib |
| 5,811,850 A | 9/1998 | Smayling et al. |
| 5,950,090 A | 9/1999 | Chen et al. |
| 5,998,301 A | 12/1999 | Pham et al. |
| 6,066,884 A | 5/2000 | Krutsick |
| 6,144,538 A | 11/2000 | Chao |
| 6,165,846 A | 12/2000 | Carns et al. |
| 6,245,689 B1 | 6/2001 | Hao et al. |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang et al. |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai et al. |
| 6,514,830 B1 | 2/2003 | Fang et al. |
| 6,521,538 B2 | 2/2003 | Soga et al. |
| 6,614,089 B2 | 9/2003 | Nakamura et al. |
| 6,713,794 B2 | 3/2004 | Suzuki |
| 6,762,098 B2 | 7/2004 | Hshieh et al. |
| 6,764,890 B1 | 7/2004 | Xu |
| 6,784,060 B2 | 8/2004 | Ryoo |
| 6,784,490 B1 | 8/2004 | Inoue et al. |
| 6,819,184 B2 | 11/2004 | Pengelly et al. |
| 6,822,296 B2 | 11/2004 | Wang |
| 6,825,531 B1 | 11/2004 | Mallikarjunaswamy |
| 6,846,729 B2 | 1/2005 | Andoh et al. |
| 6,855,581 B2 | 2/2005 | Roh et al. |
| 6,869,848 B2 | 3/2005 | Kwak |
| 6,894,349 B2 | 5/2005 | Beasom |
| 6,958,515 B2 | 10/2005 | Hower et al. |
| 7,015,116 B1 | 3/2006 | Lo et al. |
| 7,023,050 B2 | 4/2006 | Salama et al. |
| 7,037,788 B2 | 5/2006 | Ito et al. |
| 7,075,575 B2 | 7/2006 | Hynecek |
| 7,091,079 B2 | 8/2006 | Chen et al. |
| 7,148,540 B2 | 12/2006 | Shibib et al. |
| 7,214,591 B2 | 5/2007 | Hsu |
| 7,309,636 B2 | 12/2007 | Chen |
| 7,323,740 B2 | 1/2008 | Park et al. |
| 7,358,567 B2 | 4/2008 | Hsu |
| 7,427,552 B2 | 9/2008 | Jin et al. |
| 7,439,584 B2 | 10/2008 | Khemka et al. |
| 7,466,006 B2 | 12/2008 | Khemka et al. |
| 8,304,831 B2 * | 11/2012 | Zhu et al. ............... 257/343 |
| 8,482,063 B2 | 7/2013 | Lin et al. |
| 8,507,987 B2 | 8/2013 | Huang et al. |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen et al. |
| 2005/0258496 A1 | 11/2005 | Tsuchiko |
| 2006/0027874 A1 * | 2/2006 | Tsai et al. ............... 257/365 |
| 2006/0035437 A1 | 2/2006 | Mitsuhira et al. |
| 2006/0261407 A1 | 11/2006 | Blanchard et al. |
| 2006/0270134 A1 | 11/2006 | Lee et al. |
| 2006/0270171 A1 | 11/2006 | Chen et al. |
| 2007/0041227 A1 | 2/2007 | Hall et al. |
| 2007/0082440 A1 | 4/2007 | Shiratake |
| 2007/0132033 A1 | 6/2007 | Wu et al. |
| 2007/0273001 A1 | 11/2007 | Chen et al. |
| 2008/0014690 A1 * | 1/2008 | Chu et al. ............... 438/197 |
| 2008/0160697 A1 | 7/2008 | Kao |
| 2008/0160706 A1 | 7/2008 | Jung |
| 2008/0185629 A1 | 8/2008 | Nakano et al. |
| 2008/0296655 A1 | 12/2008 | Lin et al. |
| 2009/0108348 A1 | 4/2009 | Yang et al. |
| 2009/0111252 A1 | 4/2009 | Huang et al. |
| 2009/0159966 A1 | 6/2009 | Huang |
| 2009/0278208 A1 | 11/2009 | Chang |
| 2009/0294865 A1 | 12/2009 | Tang et al. |
| 2010/0006937 A1 | 1/2010 | Lee |
| 2010/0032758 A1 | 2/2010 | Wang et al. |
| 2010/0096702 A1 | 4/2010 | Chen et al. |
| 2010/0148250 A1 * | 6/2010 | Lin ............... H01L 21/761 257/335 |
| 2010/0213517 A1 | 8/2010 | Sonsky et al. |
| 2011/0057263 A1 | 3/2011 | Tang et al. |
| 2011/0068415 A1 * | 3/2011 | Huang et al. ............... 257/408 |
| 2011/0193161 A1 * | 8/2011 | Zhu ............... H01L 29/402 257/343 |
| 2012/0175679 A1 * | 7/2012 | Marino et al. ............... 257/194 |
| 2013/0161739 A1 * | 6/2013 | Tseng et al. ............... 257/336 |
| 2013/0181285 A1 * | 7/2013 | Ng et al. ............... 257/335 |
| 2014/0361367 A1 * | 12/2014 | Tseng et al. ............... 257/345 |

* cited by examiner

SEMICONDUCTOR DEVICE AND OPERATING METHOD THEREOF

BACKGROUND OF THE INVENTION

1. Field of Invention

The present invention relates to an integrated circuit (IC) technology, and particularly to a semiconductor device and an operating method thereof.

2. Description of Related Art

A laterally double-diffused metal oxide semiconductor (LDMOS) transistor is a power source device commonly used in semiconductor processes. A LDMOS transistor can provide a higher breakdown voltage ($V_{bd}$) and has a lower on-resistance ($R_{on}$) during operation, and hence, it is normally used as a high voltage device in power management IC. As electron products become more digitized and miniaturized, the demands for voltage accuracy, stability and device durability increase.

However, as the dimension of a LDMOS transistor is getting decreased, the distance between components is getting shorter. Therefore, the gate-induced drain leakage (GIDL) current of the device is often observed, and the noise from the substrate becomes serious. High GIDL current and high substrate noise result in the operation failure of the LDMOS transistor and accordingly reduce the performance of the device.

SUMMARY OF THE INVENTION

The present invention provides a semiconductor device, in which a dummy gate is disposed between the gate and the drain region for reducing the GIDL current, and a deep well region is disposed between the substrate and each well region for reducing the noise from the substrate.

The present invention further provides an operating method of the semiconductor device. The semiconductor device is a five-terminal device and can be operated without a GIDL current and a substrate noise.

The present invention provides a semiconductor device including a substrate of a first conductivity type, a first well region of the first conductivity type, a second well region of a second conductivity type, a gate, source and drain regions of the second conductivity type, a dummy gate and a first deep well region of the second conductivity type. The first well region is disposed in the substrate. The second well region is disposed in the substrate proximate to the first well region. The gate is disposed on the substrate and covers a portion of the first well region and a portion of the second well region. The source region is disposed in the first well region at one side of the gate. The drain region is disposed in the second well region at another side of the gate. The dummy gate is disposed on the substrate between the gate and the drain region. The first deep well region disposed in the substrate and surrounding the first and second well regions.

According to an embodiment of the present invention, the semiconductor device further includes a second deep well region of the first conductivity type disposed in the substrate between the first deep well region and each of the first and second well regions.

According to an embodiment of the present invention, a doping concentration of the first and second deep well regions is greater than a doping concentration of the first and second well regions.

According to an embodiment of the present invention, the semiconductor device further includes at least one doped region of the second conductivity type, disposed in the first deep well region, and at least one isolation structure, disposed in the substrate between the doped region and the source region or the drain region.

According to an embodiment of the present invention, the first well region is in contact with the second well region.

According to an embodiment of the present invention, the first well region and the second well region are separated by a distance.

According to an embodiment of the present invention, the semiconductor device further includes an isolation structure disposed in the substrate between the first and second well regions.

According to an embodiment of the present invention, a salicide-free region is present between the gate and the dummy gate.

According to an embodiment of the present invention, the semiconductor device further includes a salicide layer disposed on surfaces of the gate and the source and drain regions.

According to an embodiment of the present invention, the salicide layer is further disposed on a surface of the dummy gate.

According to an embodiment of the present invention, the gate includes amorphous silicon, polysilicon, metal, metal silicide or a combination thereof.

According to an embodiment of the present invention, the dummy gate includes amorphous silicon, polysilicon, metal, metal silicide or a combination thereof.

According to an embodiment of the present invention, the dummy gate is a floating gate.

The present invention further provides an operation of the said semiconductor device, which includes applying a first voltage to the drain region, applying a second voltage to the first deep well region, and applying a third voltage to the substrate.

According to an embodiment of the present invention, the second voltage is greater than the third voltage but less than the first voltage.

According to an embodiment of the present invention, the first voltage is about 5V and the third voltage is about zero.

According to an embodiment of the present invention, the operating method further includes applying a fourth voltage to the source region, and applying a fifth voltage to the gate.

According to an embodiment of the present invention, the fourth voltage is about zero, and the fifth voltage is about 2.5V.

According to an embodiment of the present invention, the dummy gate is a floating gate.

According to an embodiment of the present invention, the second deep well region is floating.

In view of the above, by disposing a dummy gate between the gate and the drain region and arranging a deep well region between the substrate and each well region, the GIDL current of the device can be reduced and the noise from the substrate can be decreased. Therefore, the malfunction of the device can be prevented, and the performance of the device can be significantly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
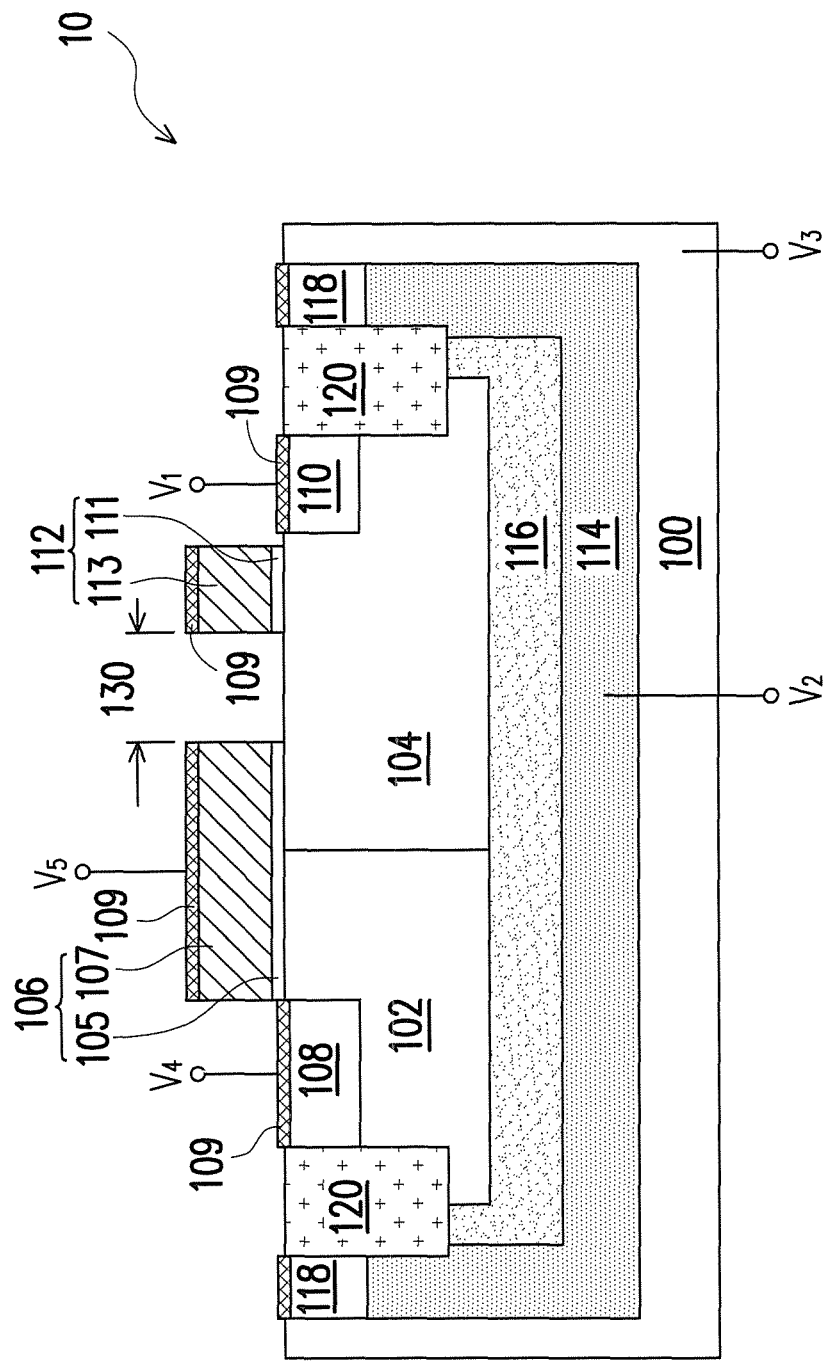
FIG. 1 is a schematic cross-sectional view of a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a semiconductor device according to an embodiment of the present invention.

The following embodiments in which the first conductivity type is P-type and the second conductivity type is N-type is provided for illustration purposes, and are not to construed as limiting the scope of the present invention. The P-type dopant includes boron, and the N-type dopant includes arsenic or phosphorous. It is appreciated by persons skilled in the art that the first conductivity type can be N-type and the second conductivity type can be P-type.

Referring to FIG. 1, the semiconductor device 10 of the invention includes a substrate 100 of a first conductivity type, a first well region 102 of the first conductivity type, a second well region 104 of a second conductivity type, a gate 106, source and drain regions 108 and 110 of the second conductivity type, a dummy gate 112 and a first deep well region 114 of the second conductivity type.

The substrate 100 can be a P-type semiconductor substrate, such as a P-type silicon substrate. The first well region 102 can be a P-type lightly doped ($P^-$) region. The second well region 104 can be an N-type lightly doped ($N^-$) region. The first well region 102 and the second well region 104 are disposed in the substrate 100 and proximate to each other. In this embodiment, the first well region 102 is in contact with the second well region 104. The doping concentration of the first well region 102 and ranges from about $1 \times 10^{12}$ to $2 \times 10^{13}$ atom/cm$^2$. The doping concentration of the second well region 104 ranges from about $5 \times 10^{12}$ to $3 \times 10^{13}$ atom/cm$^2$. Besides, the doping concentration of the first well region 102 can be the same or different from that of the second well region 104.

The gate 106 is disposed on the substrate 100 and covers a portion of the first well region 102 and a portion of the second well region 104. The gate 106 includes a gate dielectric layer 105 and a conductive layer 107. The gate dielectric layer 105 includes silicon oxide, silicon nitride, silicon oxynitride, a high-k material with a dielectric constant greater than 4, or a combination thereof. The high-k material can be metal oxide, such as includes $HfO_2$, $ZrO_2$, $Al_2O_3$, $TiO_2$, $La_2O_3$, $Y_2O_3$, $Gd_2O_3$, $Ta_2O_5$ or a combination thereof. The conductive layer 107 includes amorphous silicon, undoped or doped polysilicon, metal (e.g. W, Al or Cu), or a combination thereof.

The source and drain regions 108 and 110 can be N-type heavily doped ($N^+$) regions. The source region 108 is disposed in the first well region 102 at one side of the gate 106. The drain region 110 is disposed in the second well region 104 at another side of the gate 106.

The dummy gate 112 is disposed on the substrate 100 between the gate 106 and the drain region 110. In this embodiment, the dummy gate 112 includes a gate dielectric layer 111 and a conductive layer 113. The gate dielectric layer 111 includes silicon oxide, silicon nitride, silicon oxynitride, a high-k material with a dielectric constant greater than 4, or a combination thereof. The high-k material can be metal oxide, such as includes $HfO_2$, $ZrO_2$, $Al_2O_3$, $TiO_2$, $La_2O_3$, $Y_2O_3$, $Gd_2O_3$, $Ta_2O_5$ or a combination thereof. The conductive layer 113 includes amorphous silicon, undoped or doped polysilicon, metal (e.g. W, Al or Cu), or a combination thereof. Besides, in terms of the process availability, the gate dielectric layer 111 can have the same material and thickness with those of the gate dielectric layer 105, and the conductive layer 113 can have the same material and thickness with those of the gate dielectric layer 107. However, the present invention is not limited thereto. In another embodiment, the gate dielectric layers 105 and 111 can have different thicknesses and materials. Similarly, the conductive layers 107 and 113 can have different thicknesses and materials. For example, the conductive layer 107 can include doped polysilicon, while the conductive layer 113 can include amorphous silicon.

Herein, since the dummy gate 112 is a floating gate, the materials and number of layers thereof are trivial. In other words, the materials and layers of the dummy gate 112 can be adjusted upon the process availability.

Besides, in this embodiment, the dummy gate 112 and the drain region 110 are separated by a distance, as shown in the semiconductor device 10 of FIG. 1, but the present invention is not limited by this. In another embodiment, the borderline of the dummy gate 112 can be aligned with the borderline of the drain region 110, as shown in the semiconductor device 20 of FIG. 2. In yet another embodiment (not shown), the dummy gate 112 and the drain region 110 can be partially overlapped.

The first deep well region 114 can be an N-type doped region. The first deep well region 114 is disposed in the substrate 100 and surrounds the first and second well regions 102 and 104. In this embodiment, the first deep well region 114 surrounds the first and second well regions 102 and 104 but is not in contact with the first and second well regions 102 and 104. Besides, the first deep well region 114 has a doping concentration greater than that of the first and second well regions 102 and 104. For example, the doping concentration of the first deep well region 114 ranges from about $1 \times 10^{13}$ to $5 \times 10^{13}$ atom/cm$^2$.

Figure 2:
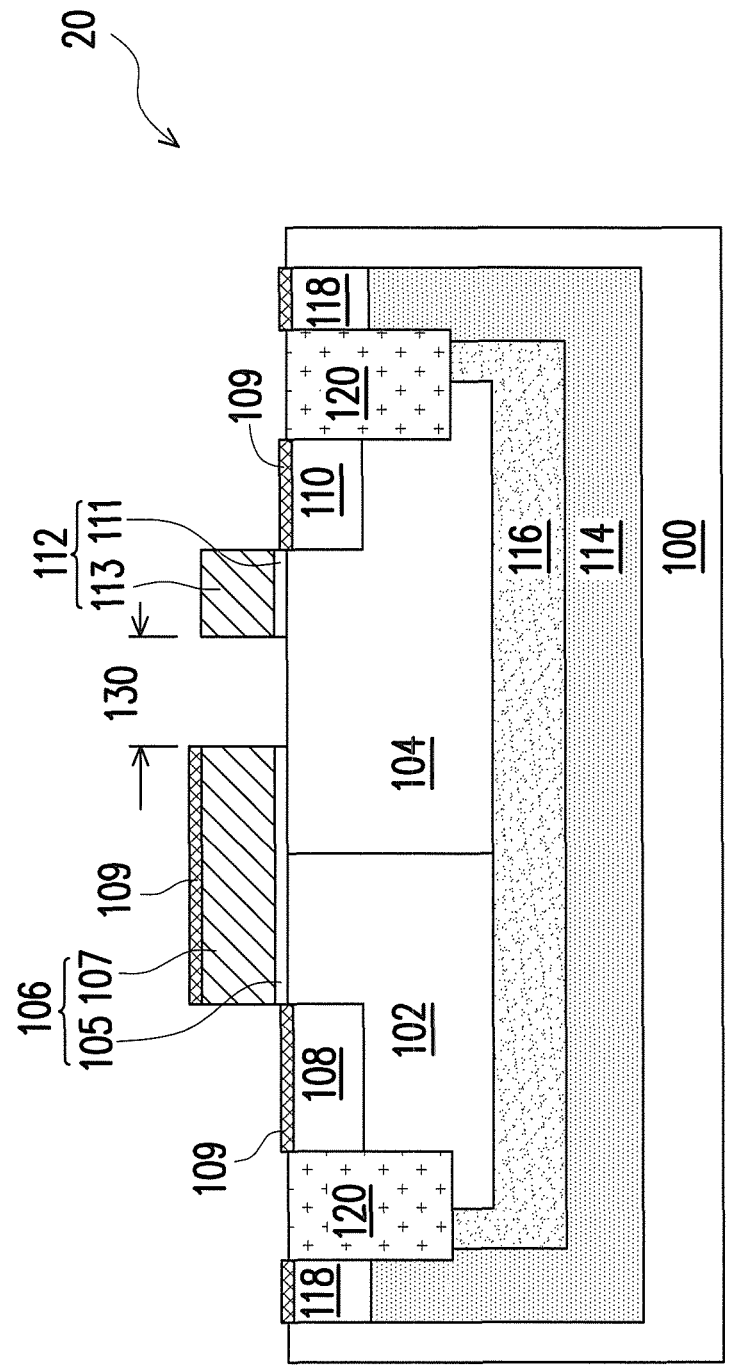
FIG. 2 is a schematic cross-sectional view of a semiconductor device according to another embodiment of the present invention.

The semiconductor device 10 further includes a salicide layer 109 at least disposed on the surfaces of the conductive layer 107 and the source and drain regions 108 and 110 for decreasing the junction resistances of the conductive layer 107 and the source and drain regions 108 and 110. The salicide layer 109 on the conductive layer 107 can be regarded as a component constituting the gate 106. The salicide layer 109 includes metal silicide, such as WSi, TiSi, CoSi, MoSi, NiSi, PdSi or PtSi. In an embodiment, the salicide layer 109 is further disposed on the surface of the conductive layer 113 and can be regarded as a component constituting the dummy gate 112, as shown in FIG. 1. In another embodiment, no salicide layer is disposed on the surface of the dummy gate 112, as shown in FIG. 2.

It is noted that a salicide-free region 130 is present between the gate 106 and the dummy gate 112. Specifically, a salicide block (SAB) layer is present in the salicide-free region 130 during the formation of the sailicide layer 109, so as to prevent formation of a salicide layer on the surface of the second well region 104 between the gate 106 and the dummy gate 112. The salicide-free region 130 and the floating dummy gate 112 of the invention play an important role in lowering the electric field between the gate 106 and the drain region 110, thereby reducing the GIDL current.

The semiconductor device 10 further includes a second deep well region 116 of the first conductivity type disposed in the substrate 100 between the first deep well region 114 and each of the first and second well regions 102 and 104. The second deep well region 116 can be a P-type doped region. In this embodiment, the second deep well region 116 surrounds and contacts the first and second well regions 102 and 104. Besides, the second deep well region 116 and the first deep well region 114 can contact with each other (as shown in FIG. 1) or can be separated from one another (not shown). In addition, the doping concentration of the first deep well region 114 can be the same or different from that of the second deep well region 116. Besides, the second deep well region 116 has a doping concentration greater than that of the first and second well regions 102 and 104. For example, the doping concentration of the second deep well region 116 ranges from about $2 \times 10^{13}$ to $5 \times 10^{13}$ atom/cm². Herein, the first and second deep well regions 114 and 116 are disposed between the substrate 100 and each of the first and second well regions 102 and 104, and such configuration can effectively reduce the noise from the substrate 100.

The semiconductor device 100 further includes at least one doped region 118 of the second conductivity type and at least one isolation structure 120. Each doped region 118 can be an N-type heavily doped (N⁺) region. In this embodiment, two doped regions 118 are disposed in the first deep well region 114 and have a doping concentration greater than that of the first deep well region 114. For example, the doping concentration of the doped regions 118 ranges from about $5 \times 10^{13}$ to $3 \times 10^{15}$ atom/cm². In an embodiment, the salicide layer 109 can be further disposed on the surfaces of the doped regions 118, so as to reduce the junction resistances of the first deep well region 114 and the doped regions 118. Besides, two isolation structures 120 are disposed in the substrate 100, one of the isolation structures 120 is located between one of the doped regions 118 and the source region 108, and the other of the isolation structures 120 is located between the other of the doped regions 118 and the drain region 110. Each isolation structure 120 can be a shallow trench isolation (STI) structure. Each isolation structure 120 includes silicon oxide, and the depth thereof is substantially the same as, greater than or less than the depth of the first and second well regions 102 and 104.

Figure 3:
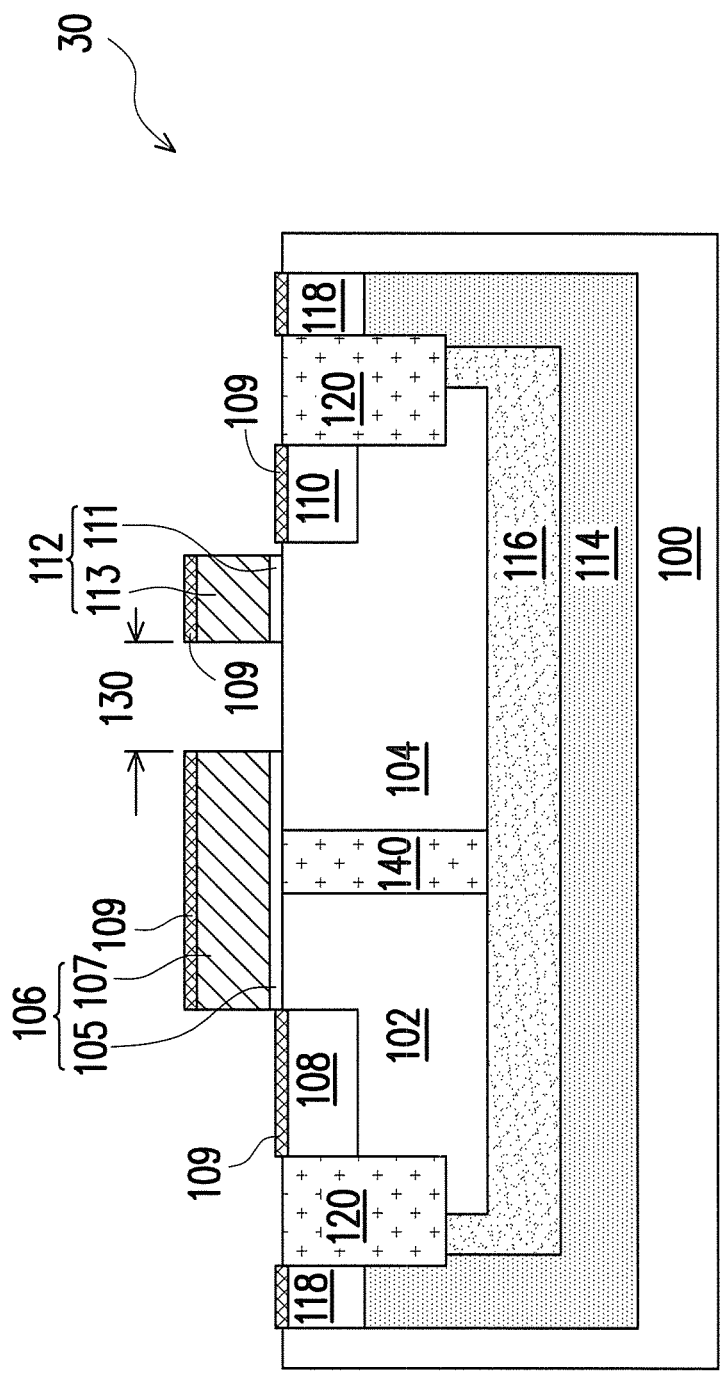
FIG. 3 is a schematic cross-sectional view of a semiconductor device according to yet another embodiment of the present invention.

The embodiment of FIG. 1 in which the first well region 102 is disposed in contact with the second well region 104 is provided for illustration purposes, and is not construed as limiting the present invention. In another embodiment, the first well region 102 and the second well region 104 can be separated by a distance. As shown in FIG. 3, the semiconductor device 30 can further includes an isolation structure 140 disposed in the substrate 100 between the first and second well regions 102 and 104. The isolation structure 140 can be a shallow trench isolation (STI) structure. The isolation structure 140 includes silicon oxide and the depth thereof is substantially the same as, greater than or less than the depth of the first and second well regions 102 and 104.

Figure 4:
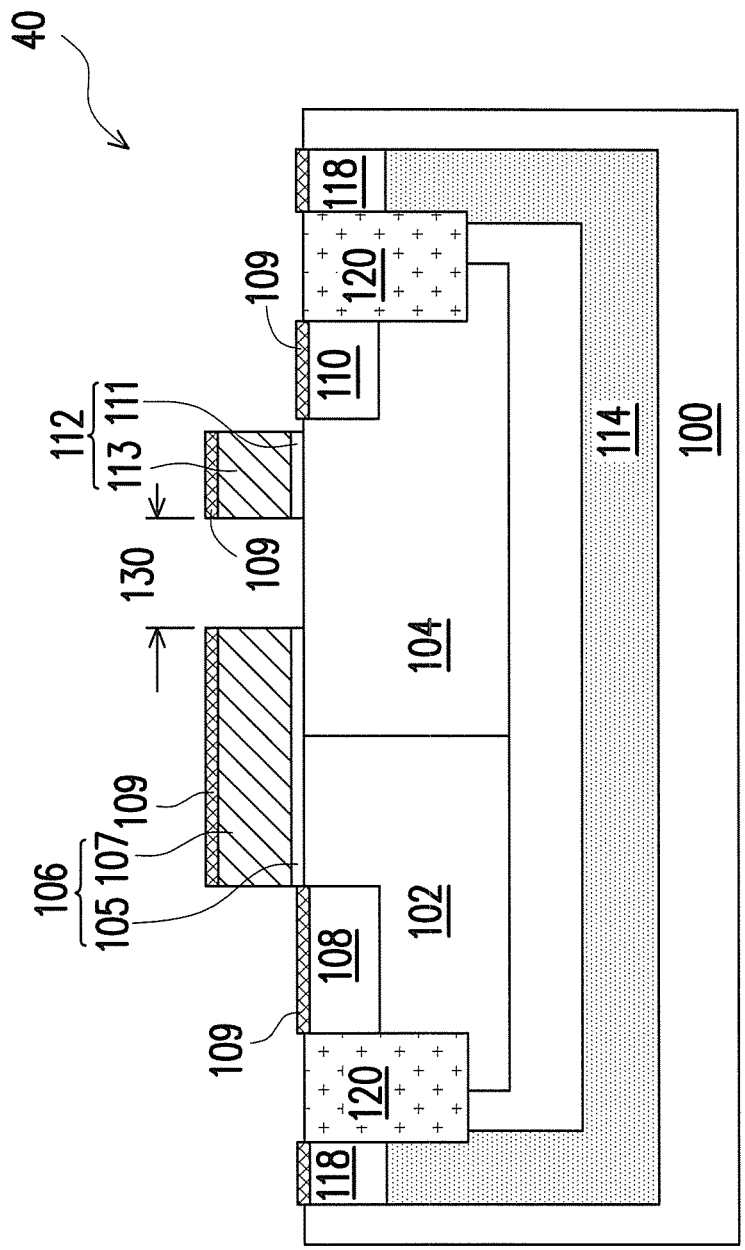
FIG. 4 is a schematic cross-sectional view of a semiconductor device according to still another embodiment of the present invention.

Besides, the second deep well region 116 is an optional component and can be omitted from the semiconductor device. As shown in FIG. 4, in the semiconductor device 40, the first deep well region 114 is the only component disposed in the substrate 100 for reducing the substrate noise. Specifically, the first deep well region 114 surrounds but keeps a distance from the first and second well regions 102 and 104.

Figure 5:
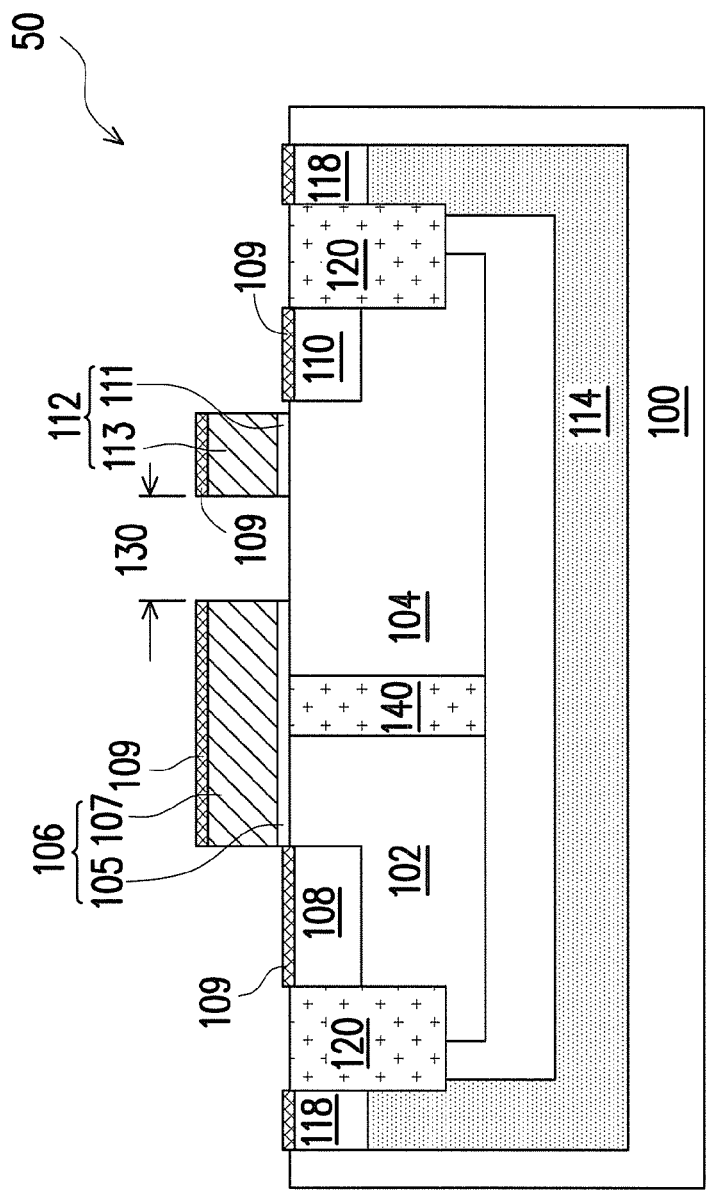
FIG. 5 is a schematic cross-sectional view of a semiconductor device according to another embodiment of the present invention.

In another embodiment, the isolation structure 140 can be further included in the device while the second deep well region 116 can be omitted from the device, as shown in the semiconductor device 50 of FIG. 5.

The operating method of the invention is described below in reference to the semiconductor device 10 of FIG. 1. As shown in FIG. 1, the operating method of the invention includes applying a first voltage $V_1$ to the drain region 110, applying a second voltage $V_2$ to the first deep well region 114, and applying a third voltage $V_3$ to the substrate 100. Herein, the second voltage $V_2$ is greater than the third voltage $V_3$ but less than the first voltage $V_1$. For example, the first voltage $V_1$ is about 5V, the third voltage $V_3$ is about zero (grounded), and the second voltage $V_2$ is about 2.5V. Besides, the first deep well region 114 and the doped regions 118 are in contact with each other and have the same conductivity type, and thus, the second voltage $V_2$ can be applied to the doped regions 118 with a higher doping concentration, so as to reduce the junction resistances.

The operation method further includes applying a fourth voltage $V_4$ to the source region 108, and applying a fifth voltage $V_5$ to the gate 106. The fourth voltage $V_4$ is about zero (grounded), and the fifth voltage $V_5$ is about 2.5V.

Herein, the dummy gate 109 and the second deep well region 116 are floating, so the semiconductor device 10 can be regarded as a five-terminal device with terminals of the source region 108, the gate 106, the drain region 110, the substrate 100 and the first deep well region 114. The operating voltages applied to the terminals are provided only for illustration purposes and are not construed as limiting the present invention.

In summary, in the semiconductor device of the invention, a dummy gate is disposed between the gate and the drain region, and a deep well region is disposed between the substrate and each well region. By such disposition, the GIDL current of the device can be reduced and the noise from the substrate can be decreased. Therefore, the malfunction of the device can be prevented, and the performance of the device can be significantly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
    a first well region of a first conductivity type, disposed in a substrate of the first conductivity type;
    a second well region of a second conductivity type, disposed in the substrate proximate to the first well region;
    a gate, disposed on the substrate and covering a portion of the first well region and a portion of the second well region;

a source region of the second conductivity type, disposed in the first well region at one side of the gate;

a drain region of the second conductivity type, disposed in the second well region at another side of the gate;

a dummy gate, disposed on the substrate between the gate and the drain region;

a first deep well region of the second conductivity type, disposed in the substrate and surrounding but keeping a distance from the first and second well regions;

at least one doped region of the second conductivity type, disposed in the first deep well region; and a second deep well region of the first conductivity type, disposed in the substrate between the first deep well region and each of the first and second well regions, wherein a doping concentration of the first and second deep well regions is greater than a doping concentration of the first and second well regions.

2. The semiconductor device of claim 1, further comprising:

at least one isolation structure, disposed in the substrate between the doped region and the source region or the drain region.

3. The semiconductor device of claim 1, wherein the first well region is in contact with the second well region.

4. The semiconductor device of claim 1, wherein the first well region and the second well region are separated by a distance.

5. The semiconductor device of claim 4, further comprising an isolation structure disposed in the substrate between the first and second well regions.

6. The semiconductor device of claim 1, wherein a salicide-free region is present between the gate and the dummy gate.

7. The semiconductor device of claim 1, further comprising a salicide layer disposed on surfaces of the gate and the source and drain regions.

8. The semiconductor device of claim 7, wherein the salicide layer is further disposed on a surface of the dummy gate.

9. The semiconductor device of claim 1, wherein the gate comprises amorphous silicon, polysilicon, metal, metal silicide or a combination thereof.

10. The semiconductor device of claim 1, wherein the dummy gate comprises amorphous silicon, polysilicon, metal, metal silicide or a combination thereof.

11. The semiconductor device of claim 1, wherein the dummy gate is a floating gate.

12. An operating method of the semiconductor device of claim 1, comprising:

applying a first voltage to the drain region;

applying a second voltage to the first deep well region; and applying a third voltage to the substrate.

13. The operating method of claim 12, wherein the second voltage is greater than the third voltage but less than the first voltage.

14. The operating method of claim 13, wherein the first voltage is 5V and the third voltage is zero.

15. The operating method of claim 12, further comprising:

applying a fourth voltage to the source region; and applying a fifth voltage to the gate.

16. The operating method of claim 15, wherein the fourth voltage is zero, and the fifth voltage is 2.5V.

17. The operating method of claim 12, wherein the dummy gate is a floating gate.

18. The operating method of claim 12, wherein the second deep well region is floating.

19. A semiconductor device, comprising:

a first well region of a first conductivity type, disposed in a substrate of the first conductivity type;

a second well region of a second conductivity type, disposed in the substrate proximate to the first well region;

a gate, disposed on the substrate and covering a portion of the first well region and a portion of the second well region;

a source region of the second conductivity type, disposed in the first well region at one side of the gate;

a drain region of the second conductivity type, disposed in the second well region at another side of the gate;

a dummy gate, disposed on the substrate between the gate and the drain region;

a first deep well region of the second conductivity type, disposed in the substrate and surrounding but keeping a distance from the first and second well regions;

at least one doped region of the second conductivity type, disposed in the first deep well region;

a second deep well region of the first conductivity type, disposed in the substrate between the first deep well region and each of the first and second well regions;

at least one first isolation structure, disposed in the substrate between the doped region and the source region or the drain region; and a second isolation structure, disposed in the substrate between the first and second well regions.

* * * * *